United States Patent [19]

Okumura et al.

[11] Patent Number: 5,786,655
[45] Date of Patent: Jul. 28, 1998

[54] STRAIN ELEMENT AND VIBRATION DEVICE

[75] Inventors: Ichiro Okumura, Yokohama; Takashi Maeno, Kawasaki, both of Japan

[73] Assignee: Canon Kabushiki Kaisha, Tokyo, Japan

[21] Appl. No.: 797,889

[22] Filed: Feb. 10, 1997

Related U.S. Application Data

[63] Continuation of Ser. No. 445,542, May 22, 1995, abandoned.

[30] Foreign Application Priority Data

May 26, 1994 [JP] Japan ................................. 6-112802
Jun. 7, 1994 [JP] Japan ................................. 6-125109

[51] Int. Cl.⁶ ............................................. H02N 2/00
[52] U.S. Cl. ................... 310/333; 310/328; 310/357; 310/366
[58] Field of Search ........................ 310/333, 328, 310/357, 366, 325, 369

[56] References Cited

U.S. PATENT DOCUMENTS

| | | | |
|---|---|---|---|
| 1,824,777 | 9/1931 | Harrison | 310/328 |
| 1,861,862 | 6/1932 | Hund | 310/328 |
| 2,742,614 | 4/1956 | Mason | 310/328 |
| 2,880,334 | 3/1959 | Mason | 310/333 |
| 3,430,316 | 3/1969 | Schafft | 310/328 |
| 4,234,812 | 11/1980 | Kawashima | 310/361 |
| 4,742,365 | 5/1988 | Bartky et al. | 310/328 |
| 4,759,107 | 7/1988 | Ogawa et al. | 310/328 |
| 4,825,227 | 4/1989 | Fischbeck et al. | 346/1.1 |
| 5,192,197 | 3/1993 | Culp | 417/322 |
| 5,225,731 | 7/1993 | Owen | 310/366 |
| 5,248,912 | 9/1993 | Zdeblick et al. | 310/332 |
| 5,266,964 | 11/1993 | Takahashi et al. | 310/357 |
| 5,315,205 | 5/1994 | Ohno et al. | 310/357 |
| 5,440,195 | 8/1995 | Ohnishi et al. | 310/359 |

FOREIGN PATENT DOCUMENTS

| | | | |
|---|---|---|---|
| 0151677 | 6/1991 | Japan | 310/325 |
| 6204581 | 7/1994 | Japan | 310/328 |

*Primary Examiner*—Thomas M. Dougherty
*Attorney, Agent, or Firm*—Fitzpatrick, Cella, Harper & Scinto

[57] ABSTRACT

A strain element which can realize shear distortion along the shearing direction includes a plurality of first electrodes provided on the surface of an electric-mechanical or mechanical-electrical energy conversion member, and second electrodes provided inside the conversion member. The combination of the electrodes used for polarization is different from that for driving or detection.

45 Claims, 15 Drawing Sheets

30V

FIG. 12 I
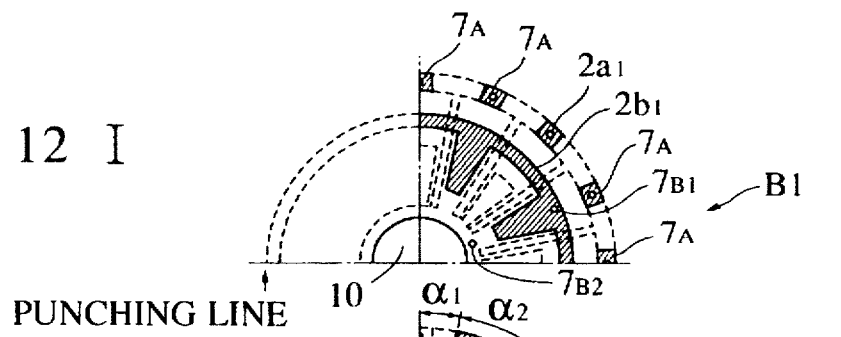
FIG. 12 II
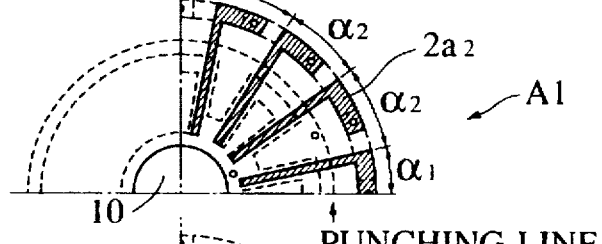
FIG. 12 III
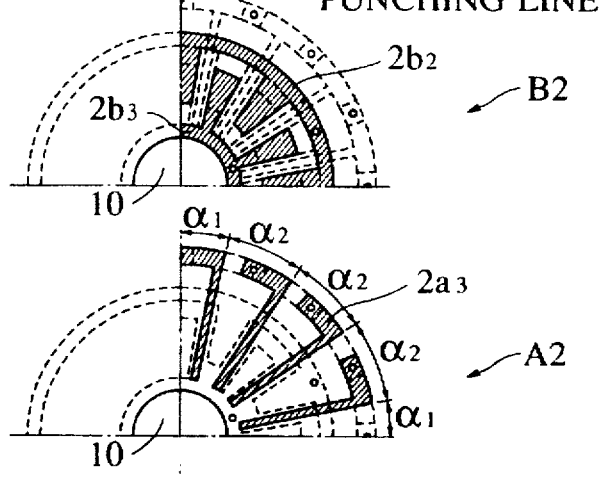
FIG. 12 IV
FIG. 12 V
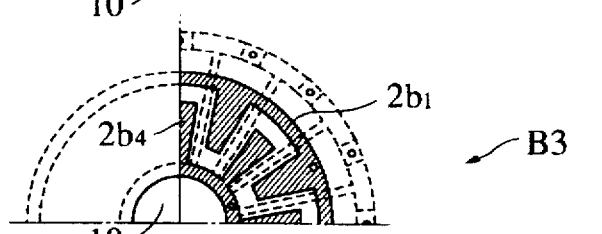
FIG. 12 VI
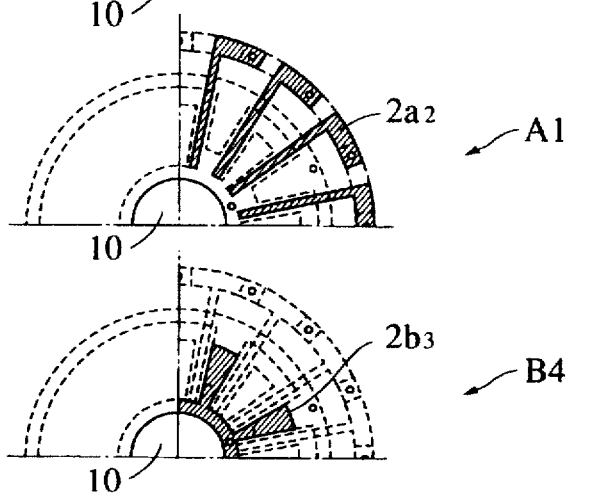

STRAIN ELEMENT AND VIBRATION DEVICE

This application is a continuation of application Ser. No. 08/445,542, filed May 22, 1995, now abandoned.

BACKGROUND OF THE INVENTION

1. Field of the Invention

The present invention relates to a strain element used for an ultrasonic motor, a vibration gyro, a machine tool which utilizes vibration, etc., and a vibration device using the strain element.

2. Description of the Related Art

Shearing or torsional vibration is widely employed in an ultrasonic motor, a vibration gyro, a machine tool, etc. For these applications, an electrostrictive element has been proposed in which polarization is made in the circumferential direction, and a vibration voltage is applied in the direction of the thickness thereof to generate shearing vibration in the circumferential direction. The electrostrictive element is integrally held between metallic materials from both sides in the direction of the thickness thereof to generate resonance vibration. An example of a conventional such electrostrictive element is described with reference to FIG. 15. An electrostrictive element 1 comprises a plurality of electrodes 2a which are circumferentially provided at equal intervals to cover the surfaces thereof. After a DC high voltage is applied between the adjacent electrodes to successively polarize all electrodes in the circumferential direction as shown by arrows in FIG. 15, all electrodes are removed, the both sides of the element are lapped again to correct the roughness caused by polarization, and electrodes are then provided again on both sides. A torsional vibration generator comprises a plurality of electrostrictive elements which are electrically laminated in parallel, and metallic materials are bonded to both sides thereof and integrally tightened by a central bolt.

However, in the above electrostrictive element, polarization between the adjacent electrodes must be performed a number of times which is equal to the number of polarizations for generating remanent polarization in the circumferential direction. In addition, in order to uniformly polarize the element in the circumferential direction thereof, the division number must be increased, thereby making the work very troublesome.

Since polarization is partially performed, the material cracks due to polarization stain, and the yield is thus decreased. With a small division number, an electric field occurs in other portions in the reverse direction due to circumferential turning to cancel necessary polarization, thereby deteriorating the polarization effect. For example, if the element is divided into 8 electrode portions in the circumferential direction thereof, as shown in FIG. 15, when polarization is performed between electrodes 2a in the direction of an arrow by applying a high-voltage current between the adjacent electrodes 2a, reverse polarization approximately occurs in the other 7 portions with intensity of 1/7. When the same polarization operation is repeated by successively applying a voltage to the other positions, the intensity of polarization, for example, between the electrodes 2a, consequently becomes zero, as shown by the following equation:

$$1-(1/7)\cdot 7=0$$

In this case, since the step of fixing electrodes again is necessary, it is difficult to produce the element.

Further, it is necessary for increasing the shearing distortion per unit input current to use a plurality of the piezoelectric elements which are laminated, thereby causing the problem of complicating the assembly process.

SUMMARY OF THE INVENTION

In accordance with one aspect of the invention, there is provided a strain element and a vibration device using the strain element comprising at least one internal electrode provided in a piezoelectric body and surface electrodes, wherein polarization is performed by applying a potential difference between respective electrodes in a shearing or torsional direction.

In accordance with another aspect of the invention, there is provided a strain element and a vibration device using the strain element comprising a plurality of polarization electrodes provided on a piezoelectric body, and strain generating or detecting electrodes provided between the respective polarization electrodes.

BRIEF DESCRIPTION OF THE DRAWINGS

FIGS. 12I–12VI are drawings illustrating an electrode pattern on each of piezoelectric plates which form the shearing strain element shown in FIG. 11;

DETAILED DESCRIPTION OF THE PREFERRED EMBODIMENTS

Figure 1:
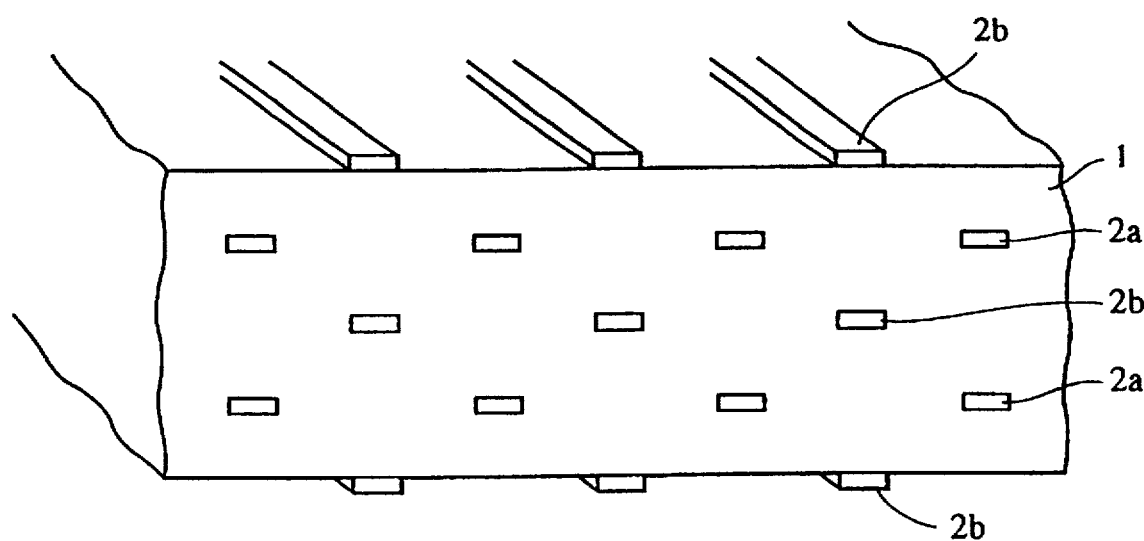
FIG. 1 is a perspective view illustrating a portion of a shearing strain element in accordance with a first embodiment of the present invention.

FIG. 1 is an enlarged perspective view showing a partial section of a shearing strain element in accordance with a first embodiment of the present invention.

In the shearing strain element of this embodiment, a plurality of driving/detecting electrodes 2b are provided at constant intervals on both sides and in the central portion in the direction of the thickness of a piezoelectric body 1 serving as an electric-mechanical/mechanical-electric energy conversion element so that the electrodes 2b on both sides are respectively opposite to the central electrodes 2b, and pairs of polarization electrodes 2a are provided in the piezoelectric body 1 at constant intervals between the driving/detecting electrodes 2b in the central portion and both sides of the piezoelectric body 1. The polarization processing of the shearing strain element in which the polarization electrodes 2a and the driving/detecting electrodes 2b are disposed in layers in the three-dimensional manner is described below with reference to FIG. 2.

The same potential is applied to the polarization electrodes 2a at diagonal positions respectively shown by (+) and (−) to apply a potential difference sufficient to polarize the whole element between the respective polarization electrodes 2a for a sufficient processing time at a sufficient temperature. This processing causes polarization in the directions shown by arrows in FIG. 2.

Figure 3:
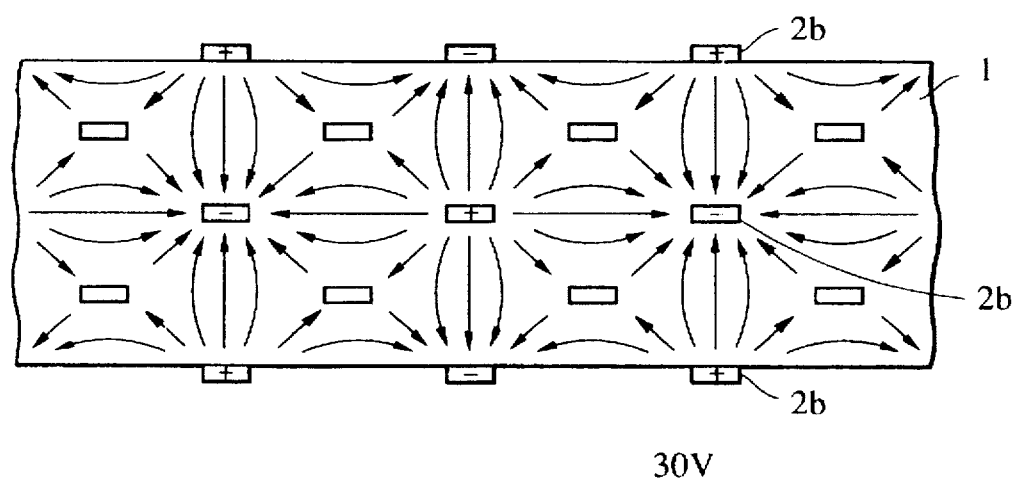
FIG. 3 is a sectional view illustrating the state wherein a voltage having a potential difference is applied to driving electrodes of the shearing strain element shown in FIG. 1.

When a voltage is applied, with the polarities shown in FIG. 3, to the driving/detecting electrodes 2b of the shearing strain element which was subjected to polarization processing as described above, an electric field occurs in each of the directions shown by arrows in FIG. 3.

Figure 2:
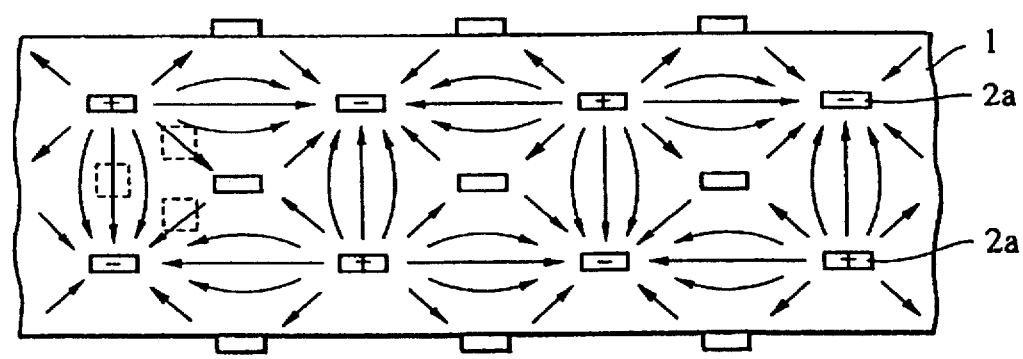
FIG. 2 is a sectional view illustrating the polarization state of the shearing strain element shown in FIG. 1.
Figure 4:
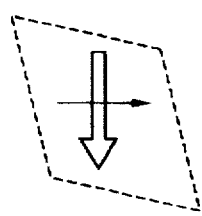
FIG. 4 is a schematic drawing illustrating the relation among a polarization direction, the direction of an electric field and shearing deformation.
Figure 5:
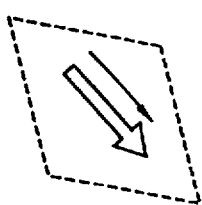
FIG. 5 is a schematic drawing illustrating the relation among a polarization direction, the direction of an electric field and shearing distortion.
Figure 6:
FIG. 6 is a schematic drawing illustrating the relation among a polarization direction, the direction of an electric field and shearing distortion.

In the shearing strain element, the polarization directions shown in FIG. 2 include three directions, i.e., the direction of thickness shown by a white arrow in FIG. 4, the direction inclined to the right shown by a white arrow in FIG. 5, and the direction inclined to the left shown by a white arrow in FIG. 6. When an electric field in the directions respectively shown by black arrows in FIGS. 4, 5 and 6 is applied to each of the square regions surrounded by the adjacent driving/detecting electrode 2b in a plane in the direction of the thickness of the element, shearing distortion occurs in each of the square regions, as shown by a broken line, to generate shift (shearing) on the upper and lower sides of the regions in the direction of the sides thereof.

When a voltage is applied to the shearing element which comprises the electrodes 2a and 2b disposed in parallel as shown in FIG. 1, and which is subjected to the polarization processing shown in FIG. 2, shearing occurs in the lateral direction perpendicular to the direction of the electrodes of the element shown in FIG. 1. For example, when an axis is provided in the direction of the thickness of the element 1 shown in FIG. 1, and the electrodes 2a and 2b are radially disposed around the axis, a torsional stain element which generates shearing distortion around the axis can be obtained.

Since the piezoelectric body 1 has upper and lower layers in which shearing distortion occurs in the direction of the thickness thereof, as shown in FIG. 3, a two-layer element can be obtained. When this two-layer element has the same thickness as a one-layer element, it is sufficient for obtaining the same strain amount to apply a half voltage, and the strain amount is doubled by applying the same voltage. It is thus possible to save electric power, and unnecessary to increase the voltage by using a DC-DC converter or the like in driving by a source battery.

Figure 7:
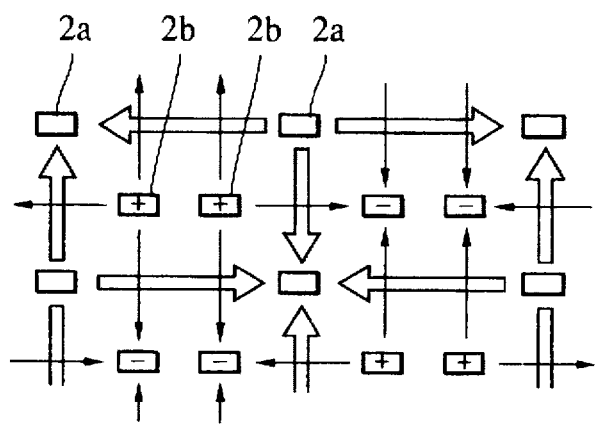
FIG. 7 is a partial sectional view of an element in accordance with a second embodiment of the invention.

FIG. 7 shows a second embodiment of the present invention.

In the first embodiment shown in FIGS. 1 to 3, the area of each of the electrodes 2a required for polarization processing can be decreased by sufficiently applying an electric field for a time necessary for the polarization processing.

On the other hand, since the strain amount at driving is proportional to the strength of the electric field, it is advantageous for distributing, as uniformly as possible, the strength of the electric field applied to the piezoelectric element 1 that the area of each of the driving electrodes 2b is large.

However, if the area of each of the driving electrodes 2b is excessively large, the density of the electric flux passing through each of the driving electrodes 2b is increased, thereby decreasing the electric flux densities between the respective polarization electrodes 2a. There is thus a limit to which the area of each of the driving electrodes 2a is increased.

In the second embodiment, two driving electrodes 2b to be provided in the piezoelectric element 1 are separately disposed within a region surrounded by four adjacent polarization electrodes 2a so that the total area of the driving electrodes can be increased with preventing a decrease in the electric flux densities between the respective polarization electrodes 2a.

In this embodiment, therefor, the amount of shearing distortion per unit input voltage at driving can be increased, and an attempt can be made to save electric power.

Of course, the division number of the driving electrodes 2b is not limited to 2 shown in FIG. 7, the division number may be 3 or more, and the laminate state of the element may comprise the three layers shown in FIG. 7 or more.

Figure 8:
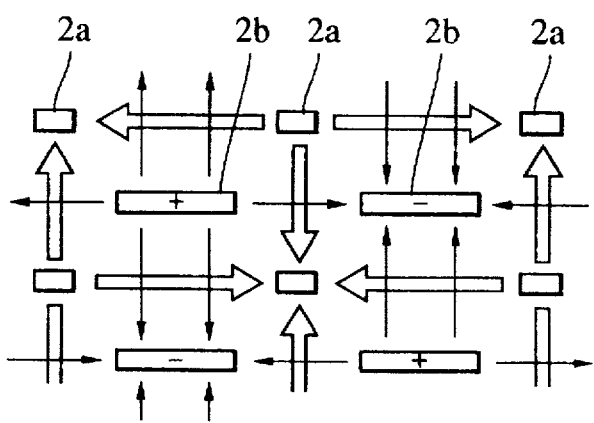
FIG. 8 is a partial sectional view of an element in accordance with a third embodiment of the invention.

FIG. 8 shows a third embodiment in which the area of each of the driving electrodes 2b is increased in place of an increase in the number of the driving electrodes 2b. The same effect as the second embodiment can be obtained.

Figure 9:
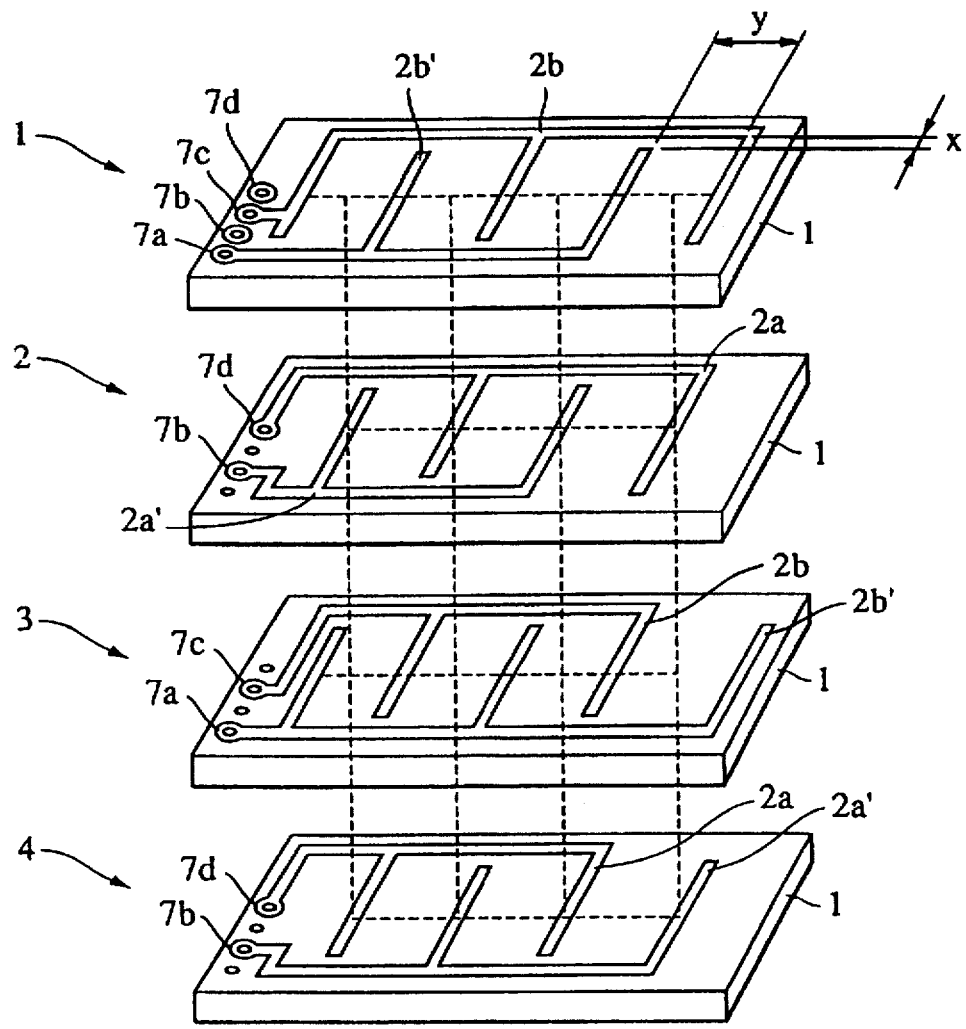
FIG. 9 is an exploded perspective view illustrating a shearing strain element in accordance with a fourth embodiment of the invention.
Figure 10:
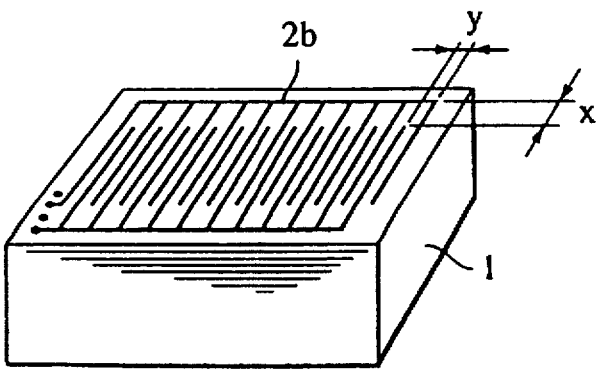
FIG. 10 is a perspective view illustrating the laminate state of the element shown in FIG. 9.

FIGS. 9 and 10 show a fourth embodiment.

This embodiment relates to an example of the electrode arrangement of the shearing strain element in accordance with the first or second embodiment. In this embodiment, piezoelectric plates shown by (1), (2), (3) and (4) are laminated to form a group, and n groups (n is an integer) are laminated.

Each of the first and third piezoelectric plates (1) and (3) has comb-toothed driving/detecting electrodes 2b and 2b' which are formed opposite to each other on the piezoelectric plate 1 by, for example, a printing method. The comblike-toothed electrode 2b of the first piezoelectric plate (1) and the comb-toothed electrode 2b of the third piezoelectric plate (3) are placed opposite to each other in the longitudinal direction thereof. Similarly, the comblike-toothed electrode 2b' of the first piezoelectric plate (1) and the comblike-toothed electrode 2b of the third piezoelectric plate (3) are placed opposite to each other in the longitudinal direction thereof.

Each of the second piezoelectric plate (2) and the fourth piezoelectric plate (4) has comb-toothed polarization electrodes 2a and 2a' which are formed opposite to each other on the piezoelectric body 1. The comblike-toothed electrode 2a of the second piezoelectric plate (2) and the comb-toothed electrode 2a' of the fourth piezoelectric plate (4) are placed opposite to each other in the longitudinal direction thereof. Similarly, the comblike-toothed electrode 2a' of the second piezoelectric plate (2) and the comb-toothed electrode 2a of the fourth piezoelectric plate (4) are placed opposite to each other in the longitudinal direction thereof.

First, second, third and fourth through holes 7a, 7b, 7c and 7d are formed at the same position on the same side of the first, second, third and fourth piezoelectric plates (1), (2), (3) and (4). The first and third through holes 7a and 7c are adapted for connecting the driving/detecting electrodes, and the second and fourth through holes 7b and 7d are adapted for connecting the polarization electrodes, as shown in FIG. 9. A conductor is sealed in these through holes for producing continuity between the upper and lower electrodes 2a, upper and lower electrodes 2a', upper and lower electrodes 2b and upper and lower electrodes 2b', and the potential difference supplied between the first and third through holes 7a and 7c is different from that supplied between the second and fourth through holes 7b and 7d so that the potential difference between the upper and lower opposite driving electrodes 2b and 2b' can be made different from that between the upper and lower opposite polarization electrodes 2a and 2a'.

In this embodiment, since n groups each comprising a two-layer element are provided, the electrodes of the first piezoelectric plate (1) of a second group is positioned below the lower side of the fourth piezoelectric plate (4) of a first group. However, since the driving/detecting electrodes may be provided on the lower side of the fourth piezoelectric plate (4) of the final group or of the piezoelectric plate (4) in an element having a two-layer structure as shown in FIG. 1, a lowermost plate having electrodes need not be provided.

In the shearing strain element constructed as described above, polarization is produced in the directions shown in FIG. 2 by applying a voltage with a predetermined potential difference to the through holes 7b and 7d, and shearing distortion in the lateral direction of the drawings is produced by applying a voltage to the through holes 7a and 7c with the polarities shown in FIG. 3 with the polarities shown in FIG. 3.

The electrodes shown in FIG. 9 are formed with electrode distances x and y which have the relation x<y for the sake of easy understanding of the positional relation between the electrodes. However, since such an arrangement produces an unnecessary electric field, the electrodes are actually formed with the relation of x>y, as shown in FIG. 10.

Figure 11:
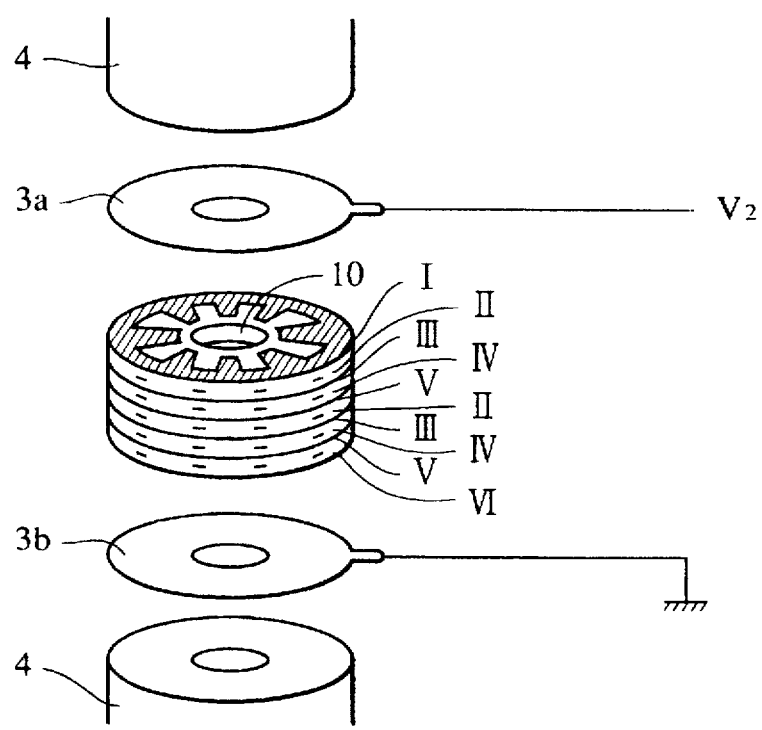
FIG. 11 is an exploded perspective view illustrating a vibrator using a shearing strain element in accordance with a fifth embodiment of the invention.
Figure 13:
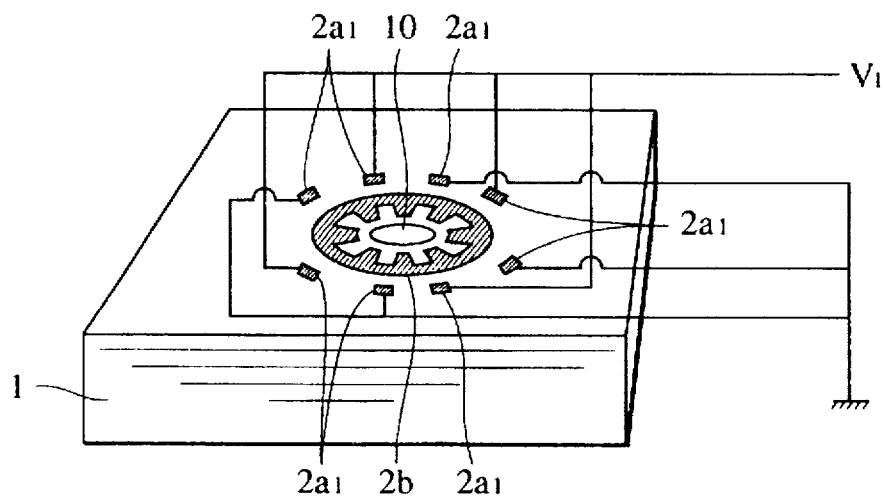
FIG. 13 is a perspective view illustrating the method of polarizing a laminate of piezoelectric plates respectively having the patterns shown in FIG. 12.

FIGS. 11 to 13 shows a fifth embodiment.

The fifth embodiment relates to a disk-formed laminated shearing strain element. The rectangular piezoelectric plates FIGS. 12I–12VI are appropriately laminated, integrated by burning, subjected to polarization processing by applying a voltage thereto as shown in FIG. 13, and then punched along the punching line shown in FIGS. 12I–12VI to obtain the cylindrical shearing strain element shown in FIG. 11. Although FIGS. 12I–12VI only a ¼ region of an electrode pattern, the patter is actually formed in a circle.

FIGS. 12I–12VI, the piezoelectric plates I to VI each having a central hole 10 have through holes 7A which are formed for polarization electrodes of the piezoelectric element 1 at an equal pitch in a peripheral portion outside the punching line, and first and second driving through holes $7B_1$, and $7B_2$ which are formed for driving/detecting electrodes in a portion inside the punching line.

The first piezoelectric plate I has pattern B1 comprising a driving electrode $2b_1$, and connecting first polarization electrodes $2a_1$, for polarization processing, which are formed on one side of the piezoelectric body 1. The driving electrode $2b_1$, connected to the first driving through holes $7B_1$ has first comblike-toothed electrode portions which are formed at equal pitches to extend toward the center, and the connecting first polarization electrodes $2a_1$, are connected to the through holes 7A. The first comblike-toothed electrode portions are formed alternately corresponding to the through holes 7A.

The second piezoelectric plate II has pattern A1 comprising second polarization electrodes $2a_2$ which are formed on one side of the piezoelectric body. The second polarization electrodes $2a_2$ are radially formed at an angular pitch of $\alpha_2$, the through holes 7A being respectively connected to the pattern portions which radially extend. The pattern portions are positioned between the respective through holes 7A and are respectively connected to the adjacent through holes in the clockwise direction.

The width of each of the pattern portions of the second polarization electrodes $2a_2$ is set so that the patter portions, the comblike-toothed electrode portions of the driving electrode $2b_1$, of the first piezoelectric plate I and the comblike-toothed electrodes portions of the driving electrode which will be described below, are not overlapped in the direction of the thickness.

The third piezoelectric plate III has pattern B2 comprising peripheral driving electrodes $2b_2$ and $2b_3$ which are formed on one side of the piezoelectric body. The second comblike-toothed electrode portions of the driving electrode $2b_2$ connected to the first driving through holes $7B_1$, are formed with an angular phase difference of $\alpha_2$ from the first comblike-toothed electrode portions, and the comblike-toothed electrode portions of the third driving electrode $2b_3$ are formed with the same phase as the first comb-toothed electrode portions. Therefore, the first comb-toothed electrode portions are respectively opposite to the third comblike-toothed electrode portions in the axial direction (the direction of thickness). In this case, since the first driving electrode $2b_1$, and the third driving electrode $2b_3$ are connected to the different through holes for applying a driving voltage, a potential different can be applied between these electrodes.

The fourth piezoelectric plate IV has pattern A2 comprising third polarization electrodes $2a_3$ which are radially formed on one side of the piezoelectric body 1 with the same phase as the second polarization electrodes $2a_2$ of the second piezoelectric plate II. The third polarization electrodes $2a_3$ are different from the second polarization electrodes $2a_2$ in that the pattern portions thereof are respectively connected to the adjacent through holes 7A in the counterclockwise direction. For example, when a voltage with a potential difference is applied to the adjacent through holes 7A, therefore, a potential different occurs between the pattern portions of the second polarization electrodes $2a_2$ and the radial pattern portions of the third polarization electrodes $2a_3$, which are opposite to each other in the axial direction.

The fifth piezoelectric plate V has pattern B3 comprising the same electrode as the first driving electrodes $2b_1$ of the first piezoelectric plate I, and a fourth driving electrode $2b_4$ connected to the second driving through holes 7B$_2$, which are formed on one side of the piezoelectric body. The fourth comblike-toothed electrode portions of the fourth driving electrode $2b_4$ are formed with the same phase as the second comblike-toothed electrode portions of the second driving electrode $2b_2$ of the third piezoelectric plate III.

The first comblike-toothed electrode portions of the first driving electrode $2b_1$ which forms pattern B3 of the fifth piezoelectric plate V are thus respectively axially opposite to the third comblike-toothed electrode portions of the third driving electrode $2b_3$ of the third piezoelectric plate III. Similarly, the fourth comblike-toothed electrode portions of the fourth driving electrode $2b_4$ which forms pattern B3 of the fifth piezoelectric plate V are respectively axially opposite to the second comblike-toothed electrode portions of the second driving electrode $2b_2$ of the third piezoelectric plate III. Since the electrodes having the opposite comblike-toothed electrode portions are respectively connected to the different driving through holes, a potential difference can be applied between the opposite comblike-toothed electrode portions.

The sixth piezoelectric plate VI has the pattern A1 formed on one side of the piezoelectric element 1, and the pattern A4 formed on the other side thereof and comprising the third driving electrode $2b_3$.

Thus, a potential difference can be applied between the third polarization electrodes $2a_3$ of the fourth piezoelectric plate IV and the pattern portions of the second polarization electrode $2a_2$ of the sixth piezoelectric plate VI, and a potential difference can also be applied between the first driving electrode $2b_1$, of the fifth piezoelectric plate V and the third driving electrode $2b_3$ of the sixth piezoelectric plate VI.

A shearing (torsional) strain element can be obtained by successively laminating the first to sixth piezoelectric plates constructed as described above. However, the number of layers can be further increased for attempting to increase the density. In this case, n groups each comprising the first piezoelectric plate I as a top layer, and the sixth piezoelectric plate VI as a bottom layer, with the second, third, fourth and fifth piezoelectric plates II, III, IV and V which are laminated in this order therebetween, can be provided.

After the piezoelectric plates laminated as described above are integrated by burning, the through holes are made conductive, and a voltage $V_1$, is alternately applied to the first polarization electrodes $2a_1$, of the first piezoelectric plate I as the top layer, while the other first polarization electrodes $2a_1$, to which no voltage is applied are grounded. This enables the same polarization processing as that shown in FIG. 2.

After the polarization processing is completed, the laminated plates are punched along the circumferential punching line shown in FIG. 12 to obtain the cylindrical laminated shearing (torsional) strain element shown in FIG. 11.

Since the polarization through holes 7A are removed by punching, no voltage is applied to the polarization electrodes during application of a driving voltage.

FIG. 11 schematically shows a vibrator comprising the cylindrical laminated shearing strain element in which metallic plates 3a and 3b are placed between vibrating elastic bodies 4 made of a metal or the like, and the both vibrating elastic bodies 4 are tightened by a bolt (not shown) to hold the laminated shearing (torsional) strain element therebetween. A voltage $V_2$ is applied to the electrode plate 3a, and the other electrode plate 3b is grounded to generate the electric field shown in FIG. 3 occurs in the piezoelectric body which forms each of the piezoelectric plates, thereby producing the shearing distortion shown in FIG. 4, 5 and 6.

In the vibrating elastic bodies 4 which are integrated, torsional vibration occurs around the axis thereof.

Figure 14:
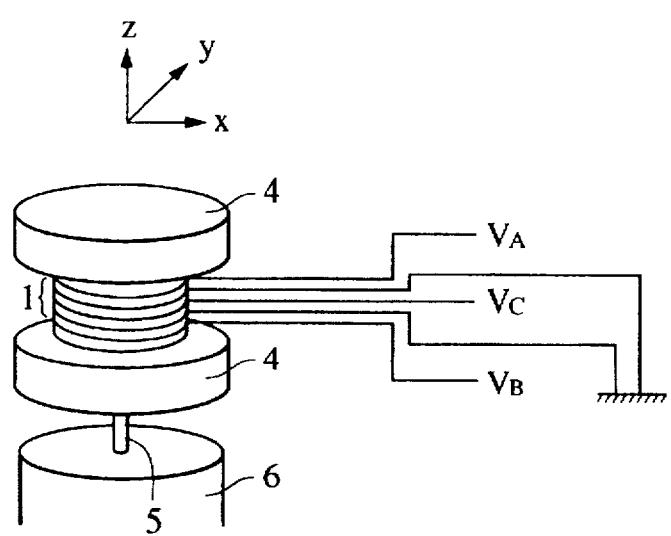
FIG. 14 is a schematic drawing illustrating a vibration gyro utilizing the vibrator shown in FIG. 11.
Figure 15:
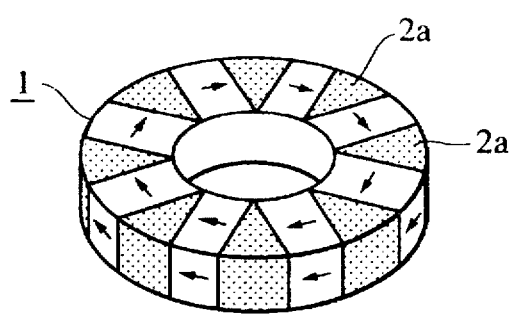
FIG. 15 is a perspective view illustrating a conventional torsional electrostrictive element.

FIG. 14 schematically shows a vibration gyro comprising as an angular velocity sensor a vibrator comprising the cylindrical laminated shearing (torsional) strain element held between the vibrating elastic bodies 4.

The vibrator further comprises an electrostrictive element which is also held for detecting bending distortion in X- and Y-axes crossing each other at right angles. When the shearing strain element is subjected to torsional vibration around the Z-axis by a driving signal $V_C$ to apply an angular velocity to the vibrator which is axially supported on a base 6 by a supporting shaft 5, Corioli's force is generated, and an angular velocity can thus be detected by detecting the Corioli's force as signals $V_A$ and $V_B$ by the electrostrictive element for detecting bending distortion.

The shearing strain element of each of the above embodiments has one or a plurality of driving internal electrodes which are provided in lines at equal intervals along the shearing direction in the piezoelectric body 1 opposite to surface driving electrodes, and which are subjected to polarization processing so that shear distortion occurs along the shearing direction when a potential difference is applied between the adjacent driving electrodes. The element can thus be formed in a laminated state, and large shearing strain can be obtained even if the driving voltage is decreased.

A circumferential shearing direction can be obtained by, for example, radially arranging the driving electrodes, and shearing vibration in the linear direction can be obtained by disposing driving electrodes in a direction perpendicular to the direction of the thickness of the piezoelectric body and the direction of arrangement of driving electrodes.

The shearing strain element is polarized by the polarization electrodes which are disposed in the piezoelectric body alternately with driving electrodes and which have a smaller area than that of the driving electrodes. This causes no hindrance to an increase in the conversion efficiency of shearing strain, and makes it unnecessary to change the electrodes after polarization processing.

The shearing strain element constructed as described above can effectively and stably generate torsional vibration, and can thus be effectively employed for vibration devices such as an ultrasonic motor, a vibration gyro, a machine tool which utilizes vibration, etc.

FIGS. 16(a) to 16(d) illustrate a sixth embodiment.

Figure 16A:
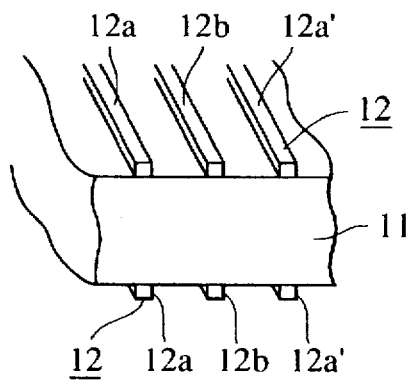
FIGS. 16(a)–16(d) are drawings illustrating a strain element in accordance with a sixth embodiment of the invention.
Figure 16B:
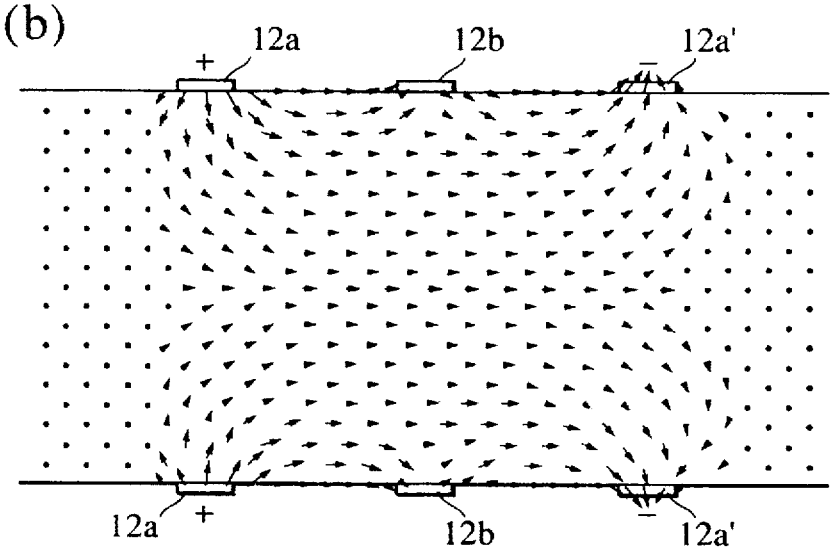
Figure 16C:
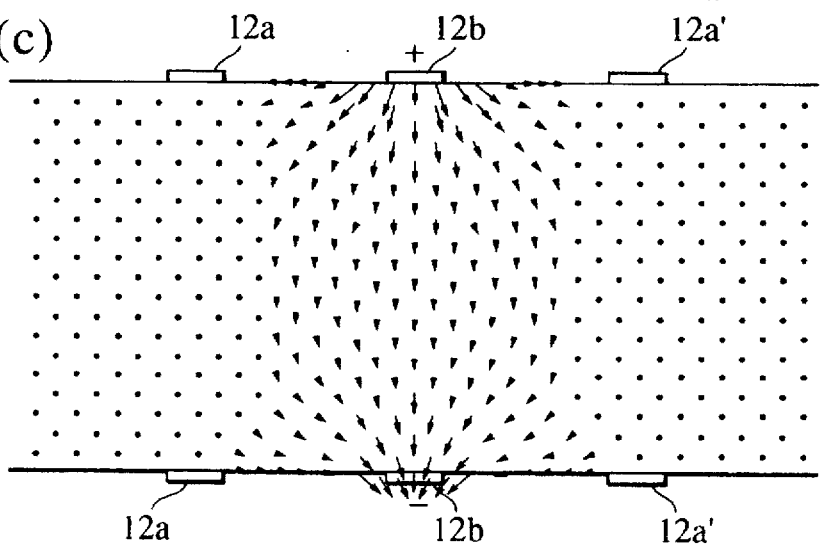
Figure 16D:
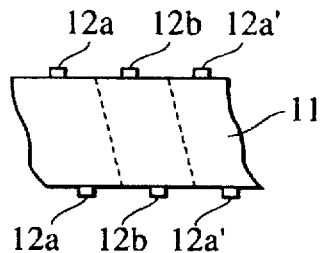

FIG. 16(a) is a perspective view showing a portion of a piezoelectric transducer (abbreviated to "PZT" hereinafter) plate as an electric-mechanical or mechanical-electric conversion element, FIG. 16(b) is a sectional view schematically showing a portion of a piezoelectric transducer (PZT) plate as an electric-mechanical or mechanical-electric conversion element during polarization, FIG. 16(c) is a sectional view schematically showing a portion of a piezoelectric transducer (PZT) plate as an electric-mechanical or mechanical-electric conversion element during use, and FIG. 16(d) is a sectional view schematically showing displacement in a portion of a piezoelectric transducer (PZT)

plate as an electric-mechanical or mechanical-electric conversion element.

As shown in FIG. 16(a), a plurality of strip electrodes 2 are provided on the upper and lower sides (front and back sides) of a PZT plate 11. When a voltage is applied between electrodes 12a and 12a', an electric field as shown by arrows in FIG. 16(b) is generated. If each of electrodes 12b has a large width, the electric field between electrodes 12a and 12b is increased, but the electric field near the central portion of the PZT plate 11 in the direction of the thickness thereof is decreased. However, when the width of the electrode 12b is decreased, as in this embodiment, an electric field with a sufficient strength is applied to the central portion of the PZT plate 11.

The PZT plate 11 is polarized by applying a sufficient electric field for a time at a temperature until the intensity of polarization is saturated.

The PZT plate 11 is held between vibrators and used as a vibrator or a strain detection element. In this case, when a voltage is applied only between the electrodes 12b provided on the front and back sides, such an electric field as shown in FIG. 16(c) is generated. Since the direction of the electric field is substantially perpendicular to the direction of polarization in most of the plate 11, the PZT plate 11 is subjected to shear distortion as shown in FIG. 16(d). Conversely, a potential difference is generated between the electrodes 12b by applying the shear distortion shown in FIG. 16(d) to the PZT plate 11.

FIGS. 16(a) to 16(d) schematically show the parallel electrodes 12a, 12b and 12a'. If the electrodes are parallel, as shown in FIG. 16, the plate can generate or detect so-called "shearing" distortion. If the electrodes are radially provided, the plate generates or detects "torsional" distortion around the axis of the radial electrodes.

Figure 17A:
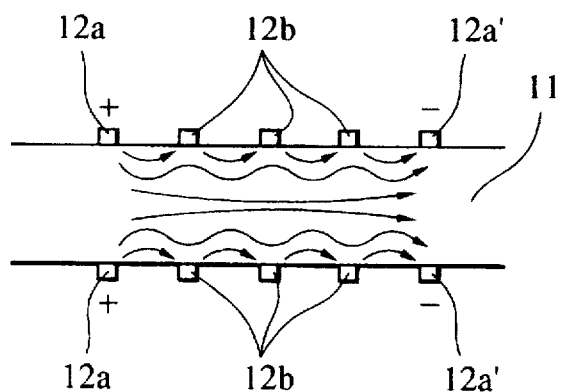
FIGS. 17(a) and 17(b) are drawings illustrating a strain element in accordance with a seventh embodiment of the invention.
Figure 17B:
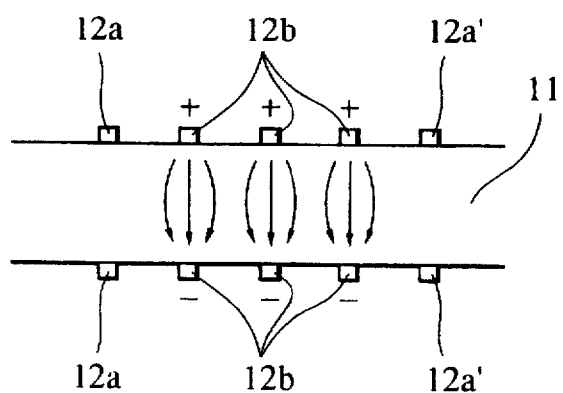

FIGS. 17(a) and 17(b) show a seventh embodiment.

In this embodiment, a plurality of strain generating/detecting electrodes 12b are provided between two pairs of polarization electrodes 12a and 12a'.

As shown in FIG. 17(a), polarization is performed by applying a voltage sufficient to saturate the intensity of polarization in the PZT plate 11 between the electrodes 12a and 12a' for a predetermined time.

When a voltage is applied between the electrodes 12b on the upper and lower sides, as shown in FIG. 17(b), the direction of an electric field is substantially perpendicular to the direction of polarization in most of the plate 11, thereby causing shear distortion in the PZT plate 11.

Conversely, a voltage is generated between the electrodes 12b by applying shear distortion to the PZT plate 11, and distortion can thus be detected. In this embodiment, the number of the distortion generating/detecting electrodes is larger than the number of the polarization electrodes, thereby causing the advantage that the PZT plate can effectively be used.

Figure 18A:
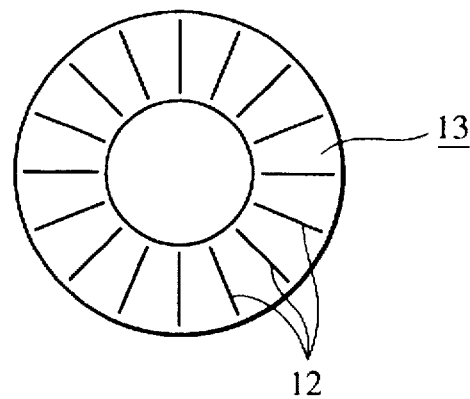
FIGS. 18(a) and 18(b) are drawings illustrating a strain element in accordance with an eighth embodiment of the invention.
Figure 18B:
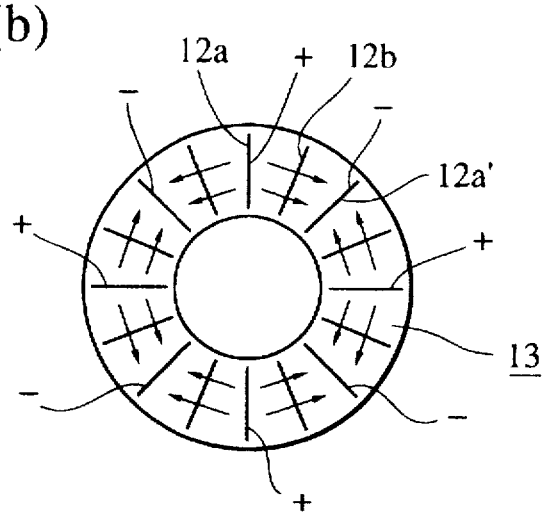

FIGS. 18(a) and 18(b) show an eighth embodiment. As shown in FIG. 18(a), electrodes 12 are radially provided on the upper and lower sides of a PZT plate ring 13. When a voltage is applied between electrodes 12a and 12a alternately provided, as shown in FIG. 16(b), polarization occurs as shown by arrows. When positive and negative voltages are successively applied to electrodes 12b which are not used for polarization, the PZT plate 13 is distorted around the axis thereof.

Figure 19:
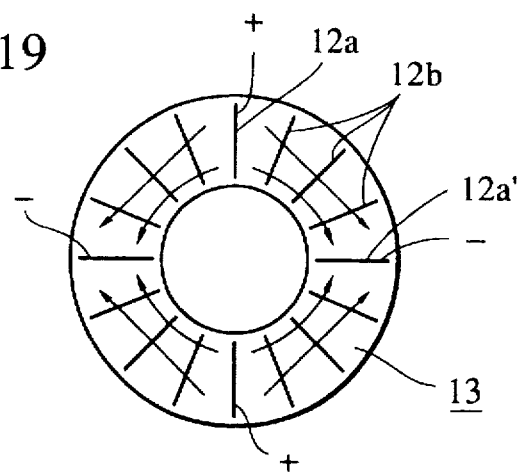
FIG. 19 is a drawing illustrating a strain element in accordance with a ninth embodiment of the invention.

FIG. 19 shows a ninth embodiment. In this embodiment, many distortion generating/detecting electrodes 12b are provided on the same PZT plate 13 as that shown in FIG. 18, as in the seventh embodiment.

Figure 20A:
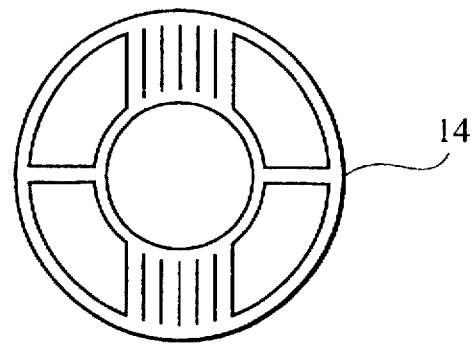
FIGS. 20(a)-20(c) are drawings illustrating a strain element in accordance with a tenth embodiment of the invention.
Figure 20B:
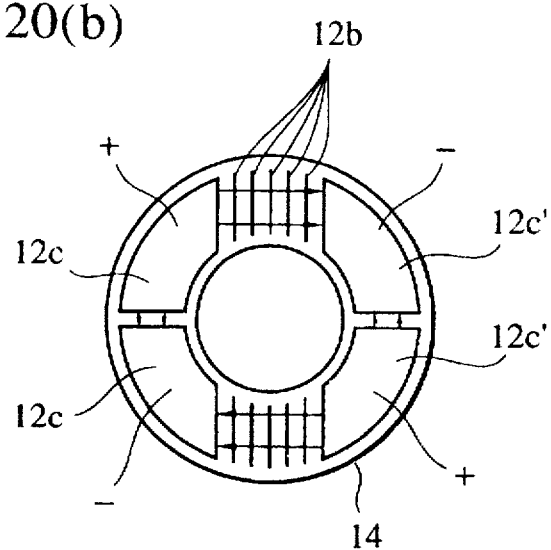
Figure 20C:
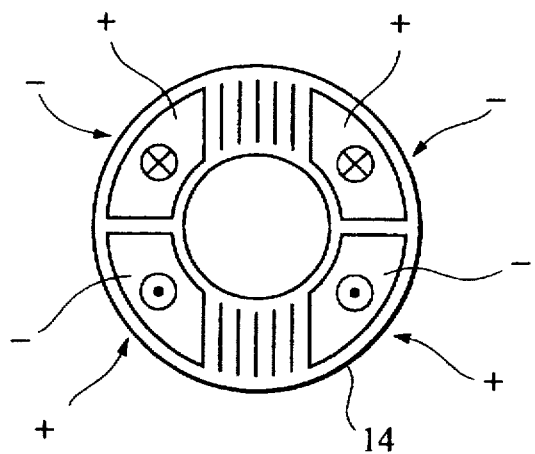
Figure 23:
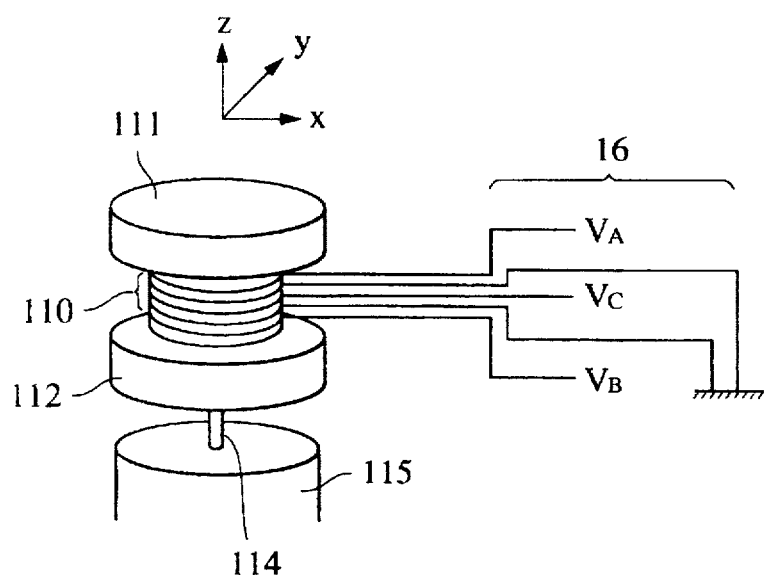
FIG. 23 is a drawing illustrating a vibration gyro comprising the strain element in accordance with the tenth embodiment shown in FIG. 20.

FIG. 20(a) to 20(c) show a tenth embodiment. This embodiment relates to a composite element in which twisting distortion and out-of-plane distortion are combined. Electrodes 12 in a pattern shown in FIG. 20(a) are provided on the upper and lower sides of a PZT plate 14. When polarization is performed by applying a voltage between electrodes 12c and 12c', as shown in FIG. 20(b), a plurality of electrodes 12b can be used for generating and detecting distortion, as in the above embodiments. When voltages having opposite polarities are respectively applied to electrodes 12c on the upper and lower sides, as shown in FIG. 20(c), out-of-plane polarization occurs, and the electrodes 12c can thus be used for generating/detecting out-of-plane distortion. For example, this embodiment can be used for generating and detecting torsional vibration and bending vibration in a vibration gyro, as shown in FIG. 23. In FIG. 23, reference numeral 110 denotes a laminate of the PZT plates 14 shown in FIG. 20. Reference numerals 111 and 112 each denote a vibrator which is bonded to the PZT plates 14. Reference numeral 114 denotes a supporting rod, and reference numeral 115 denotes a supporting base. The PZT plates 14 are driven for generating vibration and used for detecting an angular velocity. Reference numeral 116 denotes an electrical circuit device for applying or detecting a voltage with respect to the electrodes of the PZT plates 14.

In this structure, the electrodes 12c used for circumferential polarization can also be used for generating and detecting out-of-plane distortion, and the PZT plates can thus be effectively employed.

Figure 21:
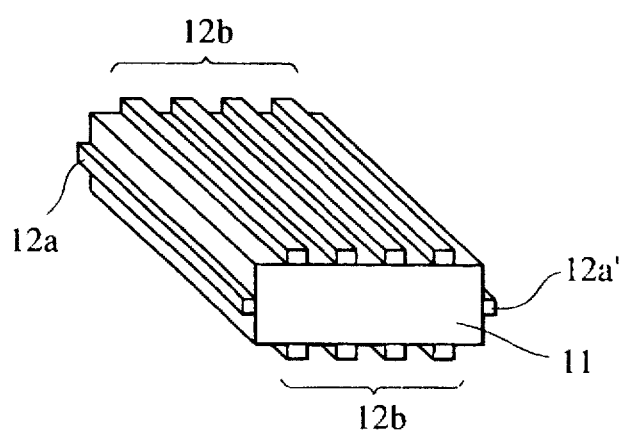
FIG. 21 is a drawing illustrating a strain element in accordance with an eleventh embodiment of the invention.

FIG. 21 shows an eleventh embodiment.

In the above embodiments, polarization electrodes 12a and 12a' are provided on the front and back sides (upper and lower sides) of the PZT plate 11. However, in this embodiment, the electrodes are provided on the side for obtaining "shearing" distortion.

Figure 22:
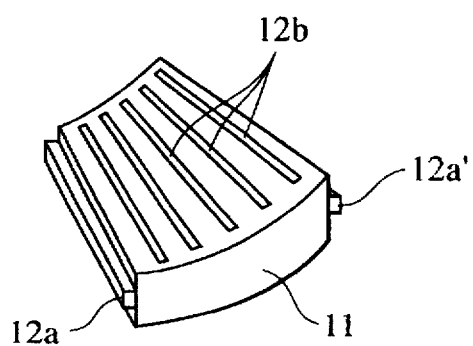
FIG. 22 is a drawing illustrating a strain element in accordance with a twelfth embodiment of the invention.

FIG. 22 shows a twelfth embodiment.

Like in the embodiment shown in FIG. 21, polarization electrodes are provided on the sides of a sector PZT plate 1 to obtain "twisting" distortion.

Since, in each of the above sixth to twelfth embodiments, the electrodes for generating and detecting distortion are provided between a plurality of polarization electrodes of the transducer element, it is possible to omit the step of removing the electrodes after polarization, prevent the occurrence of cracks in a body during the polarization process and increase the efficiency of polarization processing.

In addition, the width of the distortion generating and detecting electrodes is smaller than that of the polarization electrodes, thereby further increasing the efficiency of polarization processing.

What is claimed is:

1. A strain element comprising:
   an energy conversion member;
   a plurality of first electrodes provided on surfaces of said energy conversion member; and
   second electrodes provided inside said energy conversion member, wherein
   a combination of said electrodes used for polarization is different from a combination of electrodes used for driving or detection so that shear distortion along a shearing direction can be realized, and a first direction of an electric field during polarization is different from a second direction of an electric field during driving or detection.

2. An element according to claim 1, wherein a piezoelectric body is used as said energy conversion member.

3. An element according to claim 1, wherein said plurality of first electrodes are provided in substantially parallel alignment with each other on both first and second surfaces of said conversion member, and said second electrodes are provided between said plurality of first electrodes in substantially parallel alignment therewith.

4. An element according to claim 3, wherein said plurality of first electrodes are provided in substantially parallel alignment with each other on both said first and second surfaces of said conversion member, and said second electrodes are provided alternately with said first electrodes in substantially parallel alignment therewith.

5. An element according to claim 4, wherein said second electrodes are provided in a plurality of lines in the direction of thickness of said conversion member.

6. An element according to claim 5, further comprising third electrodes provided in a plurality of lines inside said conversion member so as to have the same position as said plurality of first electrodes and be substantially parallel therewith.

7. An element according to claim 1, wherein said second electrodes are used as polarization electrodes.

8. An element according to claim 1, wherein said first electrodes are used as driving or detecting electrodes.

9. An element according to claim 5, wherein said second electrodes are used as polarization electrodes.

10. An element according to claim 5, wherein said first electrodes are used as driving or detecting electrodes.

11. An element according to claim 6, wherein said second electrodes are used as polarization electrodes.

12. An element according to claim 6, wherein said first electrodes and third electrodes are used as driving or detecting electrodes.

13. An element according to claim 1, wherein said plurality of first electrodes are substantially radially provided on both first and second surfaces of said conversion member, and said second electrodes are substantially radially provided between said respective first electrodes.

14. An element according to claim 13, wherein said plurality of first electrodes are substantially radially provided on both said first and second surfaces of said conversion member, and said second electrodes are substantially radially provided alternately with said first electrodes.

15. An element according to claim 14, wherein said second electrodes are provided in a plurality of lines in the direction of thickness of said conversion member.

16. An element according to claim 15, further comprising third electrodes radially provided in a plurality of lines inside said conversion member so as to have the same position as that of said plurality of first electrodes.

17. An element according to claim 15, wherein said second electrodes are used as polarization electrodes.

18. An element according to claim 15, wherein said first electrodes are used as driving or detecting electrodes.

19. An element according to claim 16, wherein said second electrodes are used as polarization electrodes.

20. An element according to claim 16, wherein said first and third electrodes are used as driving or detecting electrodes.

21. An element according to claim 1, wherein a cross-sectional area of said second electrodes is greater than that of said first electrodes.

22. An element according to claim 3, wherein a cross-sectional area of said second electrodes is greater than that of said first electrodes.

23. An element according to claim 5, wherein a cross-sectional area of said second electrodes is greater than that of said first electrodes.

24. An element according to claim 6, wherein a cross-sectional area of said second electrodes is greater than that of said first electrodes.

25. An element according to claim 5, wherein the number of said second electrodes is greater than that of said first electrodes.

26. An element according to claim 6, wherein the number of said second electrodes is greater than that of said first electrodes.

27. An element according to claim 13, wherein a cross-sectional area of said second electrodes is greater than that of said first electrodes.

28. An element according to claim 15, wherein a cross-sectional area of said second electrodes is greater than that of said first electrodes.

29. An element according to claim 16, wherein a cross-sectional area of said second electrodes is greater than that of said first electrodes.

30. An element according to claim 14, wherein a cross-sectional area of said second electrodes is greater than that of said first electrodes.

31. An element according to claim 16, wherein the number of said second electrodes is greater than that of said first electrodes.

32. An element according to claim 4 wherein a cross-sectional area of said second electrodes is greater than that of said first electrodes.

33. A strain element comprising:

an energy conversion member; and means for producing shear distortion of said energy conversion member originating partly inside said energy conversion member by providing a three-dimensional arrangement of a plurality of polarization electrodes and strain generating or detecting electrodes, wherein said plurality of polarization electrodes are provided on said energy conversion member; and wherein said strain generating or detecting electrodes are provided between said plurality of polarization electrodes, wherein a first direction of an electric field during polarization is different from a second direction of an electric field during strain generation or detection such that shear distortion can be realized, with at least one electrode of said plurality of polarization electrodes and said strain generating or detecting electrodes being provided to the inside of said energy conversion member.

34. A strain element comprising:

an energy conversion member; and means for producing shear distortion of said energy conversion member originating partly inside said energy conversion member by providing a three-dimensional arrangement of a plurality of polarization electrodes and at least one pair of strain generating or detecting electrodes, wherein said plurality of polarization electrodes are provided on two sides of said energy conversion member; and wherein said at least one pair of strain generating or detecting electrodes are provided between said plurality of polarization electrodes, wherein a first direction of an electric field during polarization is different from a second direction of an electric field during strain generation or detection such that shear distortion can be realized, with at least one electrode of said pair of strain generating or detecting electrodes being provided to the inside of said energy conversion member.

35. An element according to claim 33, wherein said plurality of polarization electrodes are provided in substantially parallel alignment with each other.

36. An element according to claim 34, wherein said plurality of polarization electrodes are provided in substantially parallel alignment with each other.

37. An element according to claim 33, wherein a width of each of said polarization electrodes is greater than that of said strain generating or detecting electrodes.

38. An element according to claim 34, wherein a width of each of said polarization electrodes is greater than that of said strain generating or detecting electrodes.

39. An element according to claim 33, wherein said plurality of polarization electrodes are substantially radially provided.

40. An element according to claim 34, wherein said plurality of polarization electrodes are substantially radially provided.

41. An element according to claim 2, wherein said piezoelectric body is an electric-mechanical or mechanical-electric energy conversion member.

42. An element according to claim 33, wherein said energy conversion member is an electric-mechanical or mechanical-electric energy conversion member.

43. An element according to claim 34, wherein said energy conversion member is an electric-mechanical or mechanical-electric energy conversion member.

44. An element according to claim 33, wherein said strain generating or detecting electrodes are provided inside said energy conversion member.

45. An element according to claim 34, wherein said strain generating or detecting electrodes are provided inside said energy conversion member.

* * * * *

UNITED STATES PATENT AND TRADEMARK OFFICE
CERTIFICATE OF CORRECTION

PATENT NO. : 5,786,655

DATED : July 28, 1998

INVENTOR(S) : Okumura et al.

It is certified that error appears in the above-identified patent and that said Letters Patent is hereby corrected as shown below:

On the title page,

[56] REFERENCES CITED:

FOREIGN PATENT DOCUMENTS, "6204581" should read
--6-204581--.

COLUMN 5:

Line 65, "plates" should read --plates shown in--.

COLUMN 6:

Line 4, "12VI" should read --12VI show--.

COLUMN 8:

Line 7, "occurs" should be deleted.

UNITED STATES PATENT AND TRADEMARK OFFICE
CERTIFICATE OF CORRECTION

PATENT NO. : 5,786,655

DATED : July 28, 1998

INVENTOR(S) : Okumura et al.

It is certified that error appears in the above-identified patent and that said Letters Patent is hereby corrected as shown below:

COLUMN 9:

Line 60, "12a" (second occurrence) should read --12a'--.

COLUMN 10:

Line 3, "FIG." should read --FIGS.--.

Signed and Sealed this

Twenty-ninth Day of June, 1999

Attest:

Attesting Officer

Q. TODD DICKINSON

Acting Commissioner of Patents and Trademarks